(12) United States Patent
Lautzenhiser

(10) Patent No.: US 10,277,231 B1
(45) Date of Patent: Apr. 30, 2019

(54) DC COUPLED PHASE LOCKED LOOP FM DISCRIMINATOR

(71) Applicant: Emhiser Research Limited, Chemainus (CA)

(72) Inventor: Lloyd L. Lautzenhiser, Verdi, NV (US)

(73) Assignee: Emhiser Research Limited, Chemainus (CA)

( * ) Notice: Subject to any disclaimer, the term of this patent is extended or adjusted under 35 U.S.C. 154(b) by 0 days.

(21) Appl. No.: 15/982,262

(22) Filed: May 17, 2018

(51) Int. Cl.
*H03L 7/083* (2006.01)
*H03L 7/099* (2006.01)
*H03L 1/02* (2006.01)
*H03L 7/10* (2006.01)

(52) U.S. Cl.
CPC .............. *H03L 7/083* (2013.01); *H03L 1/022* (2013.01); *H03L 7/099* (2013.01); *H03L 7/10* (2013.01)

(58) Field of Classification Search
CPC ......... H03L 1/022; H03L 7/083; H03L 7/099; H03L 7/10; H03L 7/101; H03L 7/102
USPC ................... 327/147, 150, 156, 159
See application file for complete search history.

(56) References Cited

U.S. PATENT DOCUMENTS

| | | | |
|---|---|---|---|
| 4,087,756 A | 5/1978 | Rogers, Jr. | |
| 4,107,624 A | 8/1978 | Turner | |
| 4,286,237 A | 8/1981 | James | |
| 4,792,768 A | 12/1988 | Fried et al. | |
| 4,856,085 A | 8/1989 | Horvat | |
| 4,937,537 A | 6/1990 | Nyqvist | |
| 5,612,975 A | 3/1997 | Becker et al. | |
| 5,650,749 A | 7/1997 | Main | |
| 5,802,462 A | 9/1998 | Lautzenhiser | |
| 5,850,164 A | 12/1998 | Mellot | |
| 5,949,281 A | 9/1999 | Sharpe | |
| 6,016,080 A | 1/2000 | Zuta et al. | |
| 6,118,345 A | 9/2000 | Scheffold | |
| 6,223,061 B1 | 4/2001 | Dacus et al. | |
| 6,829,311 B1 | 12/2004 | Riley | |
| 7,653,318 B2 | 1/2010 | Li et al. | |
| 10,141,943 B1 * | 11/2018 | Williams | H03L 7/1075 |
| 2005/0237086 A1 * | 10/2005 | Galloway | H03L 7/0807 327/16 |
| 2009/0015338 A1 * | 1/2009 | Frey | H03L 7/0802 331/16 |

OTHER PUBLICATIONS

"A Fully-Integrated HIFI PLL FM—Demodulator", Aad Sempel and Han van Nieuwenburg, 1990 IEEE International Solid-State Circuits Conference, Thursday Feb. 15, 1990 (3 pages).

\* cited by examiner

*Primary Examiner* — William Hernandez
(74) *Attorney, Agent, or Firm* — Taylor IP, P.C.

(57) ABSTRACT

An electronic assembly having a phase locked discriminator circuit that includes a phase locked loop (PLL), a voltage controlled oscillator (VCO), a signal output integrator, and a direct current (DC) drift reducing circuit. The PLL has an input to receive an oscillating signal. The signal output integrator, the PLL and the VCO are all electrically coupled together. The DC drift reducing circuit is electrically coupled to the PLL, the signal output integrator and the VCO. The DC drift reducing circuit detects a DC drift of an output of the signal output integrator by comparing a frequency of the oscillating signal to the DC drift.

21 Claims, 5 Drawing Sheets

DC COUPLED PHASE LOCKED LOOP FM DISCRIMINATOR

BACKGROUND OF THE INVENTION

1. Field of the Invention

The present invention relates to a DC coupled phase locked loop FM discriminator, and, more particularly, to a DC coupled phase locked loop FM discriminator having a DC output drift reduction circuit.

2. Description of the Related Art

Phase-locked loop (PLL) circuits are often used as part of a skew reduction technique, particularly as system bandwidths increase. In the phase-locked loop, a voltage-controlled oscillator produces a local clock. The phases of the local clock and a reference clock are compared by a phase-frequency detector, with the resulting error signal used to drive the voltage-controlled oscillator by way of a loop filter. The feedback from the loop filter phase locks the local clock to the reference clock. Stability of the feedback loop, however, depends in part on the loop filter. The electronic characteristics of the loop filter, in turn, often depend significantly on manufacturing parameters. As a result, the same loop filter design may result in a stable feedback loop when manufactured with one process but an unstable loop when manufactured by another. It is difficult to produce a single loop filter design for use with all manufacturing processes, and the design of the loop filter typically must be optimized on a process by process basis.

The DC voltage drifting of a PLL circuit is also subject to changes over time and as the temperature of the circuit components vary. Such drifting is undesirable and impacts that usefulness of the PLL circuit.

What is needed in the art is a circuit technique to eliminate, or at least greatly reduce, the DC drift of a PLL circuit.

SUMMARY OF THE INVENTION

The present invention provides a DC voltage drift detection circuit that additionally compensates for the DC drift in an FM discriminator circuit.

The invention in one form is directed to an electronic assembly having a phase locked discriminator circuit that includes a phase locked loop (PLL), a voltage controlled oscillator (VCO), a signal output integrator, and a direct current (DC) drift reducing circuit. The PLL has an input to receive an oscillating signal. The signal output integrator, the PLL and the VCO are all electrically coupled together. The DC drift reducing circuit is electrically coupled to the PLL, the signal output integrator and the VCO. The DC drift reducing circuit detects a DC drift of an output of the signal output integrator by comparing a frequency of the oscillating signal to the DC drift.

The invention in another form is directed to a phase locked FM discriminator circuit that includes a phase locked loop (PLL), a voltage controlled oscillator (VCO), a signal output integrator, and a direct current (DC) drift reducing circuit. The PLL has an input to receive an oscillating signal. The signal output integrator, the PLL and the VCO are all electrically coupled together. The DC drift reducing circuit is electrically coupled to the PLL, the signal output integrator and the VCO. The DC drift reducing circuit detects a DC drift of an output of the signal output integrator by comparing a frequency of the oscillating signal to the DC drift.

The invention in yet another form is directed to a method of reducing DC drift in an FM discriminator circuit, the method includes the steps of: receiving an oscillating signal at an input of a phase locked loop circuit; sending a generated frequency from a voltage controlled oscillator (VCO) to the phase locked loop; coupling a signal output integrator to the phased locked loop and to the VCO; and detecting a direct current (DC) drift of an output of the signal output integrator with a DC drift reducing circuit by comparing a frequency of the oscillating signal to a signal generated that is representative of a DC level on the output.

An advantage of the present invention is that it detects and compensates for a DC drift of an output signal.

Another advantage of the present invention is that the DC drift of the circuit that accumulates with time, temperature and component value variations is compensated for.

BRIEF DESCRIPTION OF THE DRAWINGS

The above-mentioned and other features and advantages of this invention, and the manner of attaining them, will become more apparent and the invention will be better understood by reference to the following description of an embodiment of the invention taken in conjunction with the accompanying drawings, wherein.

Corresponding reference characters indicate corresponding parts throughout the several views. The exemplification set out herein illustrate one embodiment of the invention and such exemplification is not to be construed as limiting the scope of the invention in any manner.

DETAILED DESCRIPTION OF THE INVENTION

Figure 1:
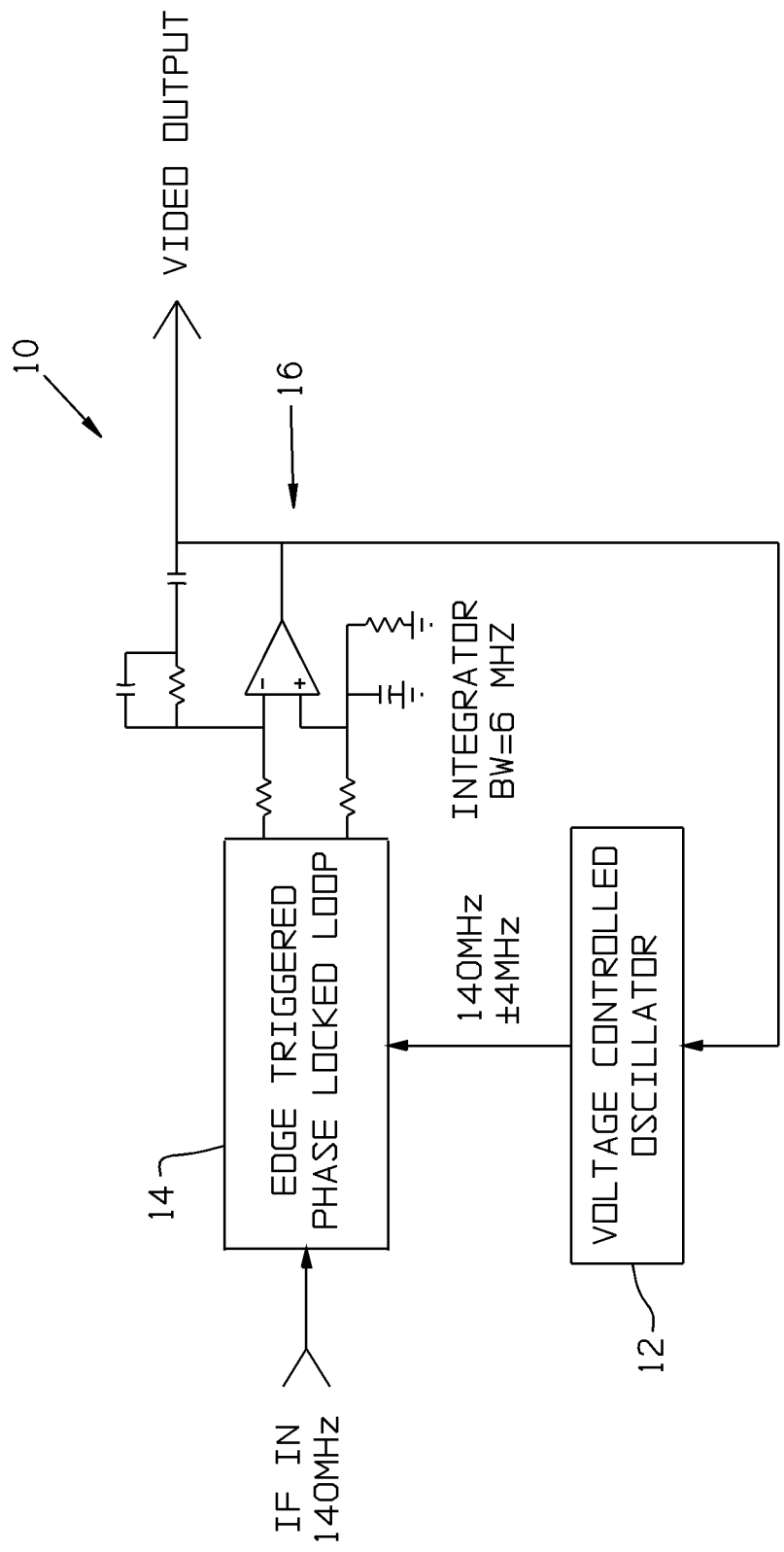
FIG. 1 is a schematical representation of a prior art Phase Locked Loop circuit.

Referring now to the drawings, and more particularly to FIG. 1, there is shown a block diagram of a prior art phase locked loop (PLL) FM discriminator 10. This prior art circuit operates as follows: Assume that the Intermediate Frequency (IF) input has a center frequency (Fc) of 140 MHz and a deviation of ±4 MHz, and that a Voltage Controlled Oscillator (VCO) 12 outputs a frequency of 140 MHz to a PLL circuit 14 when the input from an Integrator 16 is equal to 0 V DC. Further assume that VCO 12 outputs frequencies of 144 MHz and 136 MHz when the input to VCO 12 is +4 V DC and −4 V DC respectively. Still further assume that the Integrator 16 output stays at the value it had previously integrated to when the inputs to the PLL were/are at the same frequency and are in phase.

When this circuit is initiated, the output of integrator 16 will be at 0 V DC. If the IF input is at 140 MHz, the VCO 12 output will also be at 140 MHz, the two inputs to the mixer will then be equal, and the loop is therefore locked.

If the IF input increases to 144 MHz the output of integrator 16 will increase to +4 V DC which will in turn increase the output frequency of VCO 12 to 144 MHz and the loop remains locked. Similarly, at an input IF frequency of 136 MHz the integrator 16 output will swing to −4 V DC and again the loop remains locked.

Note that the output of integrator 16 is the intelligence—i.e. the discriminated output. Note further that it is DC coupled. When the output is either at +4 V DC, −4 V DC or anywhere in between, there is no tendency for the output to return to 0 V DC unless of course the IF input returns to 140 MHz.

The problem with the prior art PLL circuit 10 of FIG. 1 arises when the center frequency of VCO 12 drifts due to component variation, temperature, time, or initial setting. For example, assume that due to one or more of these reasons the center frequency Fc moves to 138 MHz with 0 V DC input from integrator 16. The output of integrator 16 would then need to move to +2 V DC to bring the VCO 12 output back to 140 MHz and put the loop back into lock. Note that the loop is still DC coupled but the output will now swing from −2 V DC to +6 V DC rather than the desired ±4 V DC.

Figure 2:
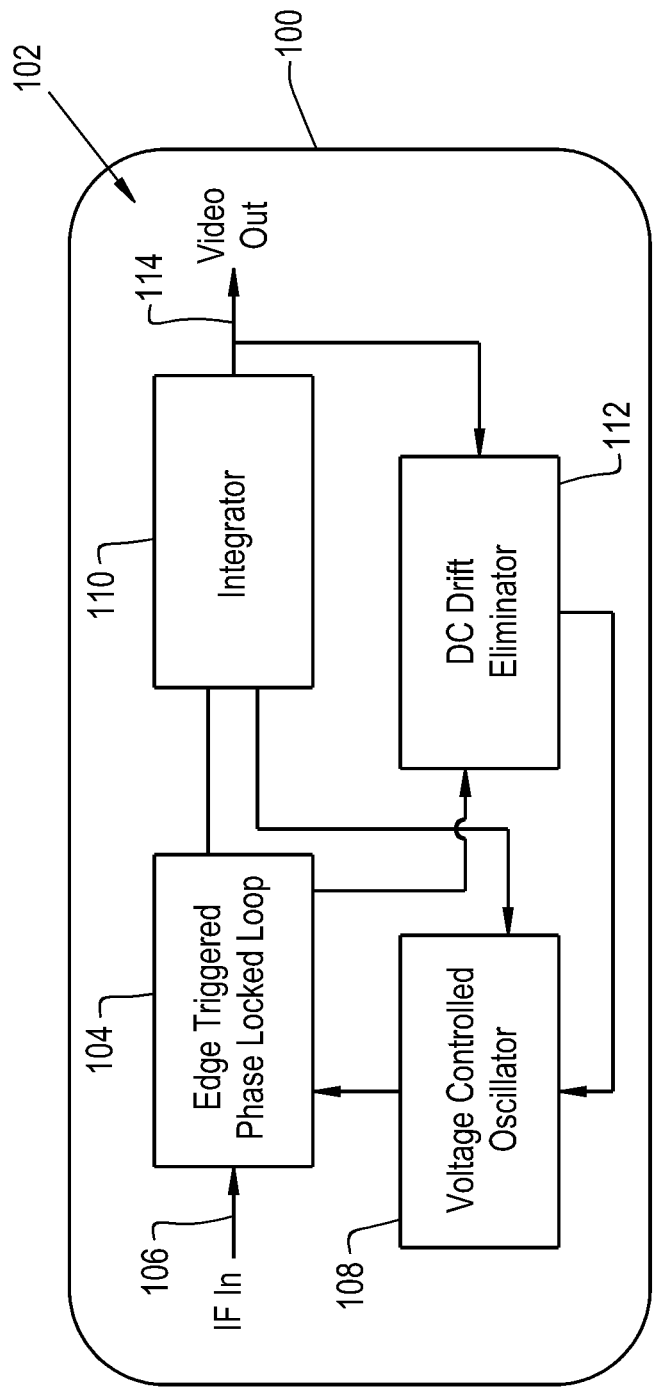
FIG. 2 is a schematical representation of an embodiment of a DC coupled Phase Locked Loop FM discriminator circuit of the present invention.

Now, additionally referring to FIG. 2 there is illustrated an electronic assembly 100 that includes a phase locked discriminator circuit 102 having a phase locked loop 104 with an input 106 to receive an oscillating signal (IF IN). A voltage controlled oscillator (VCO) 108 is electrically coupled to phase locked loop 104. A signal output integrator 110 is electrically coupled to phased locked loop 104 and to VCO 108. The present invention also includes a direct current (DC) drift reducing circuit 112 that is electrically coupled to phase locked loop 104, signal output integrator 110 and VCO 108. DC drift reducing circuit 112 detects a DC drift of an output 114 of signal output integrator 110 by comparing a frequency of the oscillating signal to the DC drift. The DC drift reducing circuit 112 compensates for the DC drift by supplying at least a portion of a DC voltage to the VCO 108 to thereby reduce the DC drift of the output 114 of the signal output integrator 110.

Figure 3:
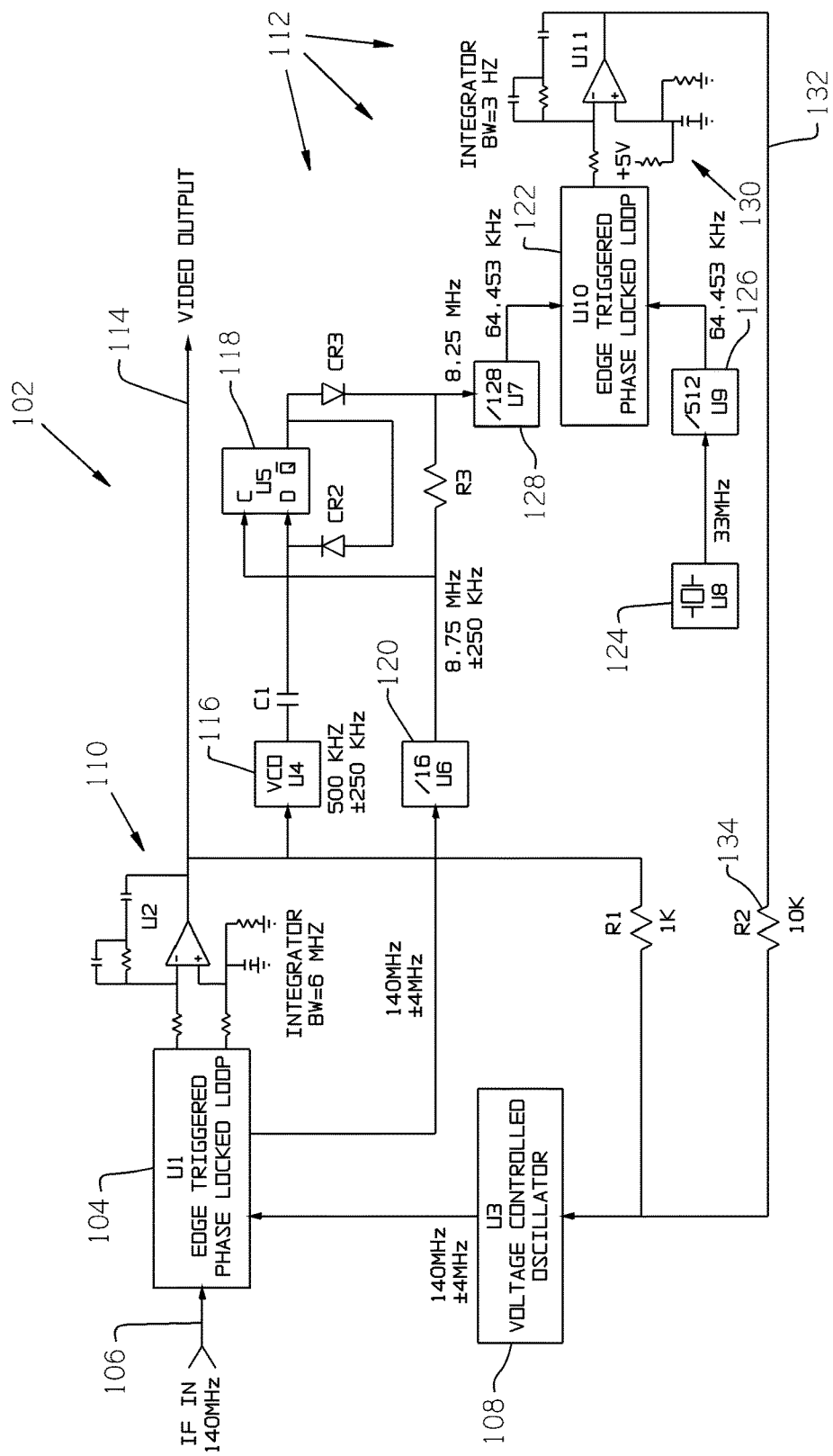
FIG. 3 is a circuit diagram with more details of the circuit of FIG. 2.

Now additionally referring to FIG. 3 there are shown some additional details of circuit 102 and more specifically DC drift reducing circuit 112. Some components in the figures may have reference characters associated therewith that are not discussed herein. Such reference characters are consistent with similar references used in the electronics field. Further, frequency values and voltages are representative of other values that can also be used, but are included as those values which may be discussed herein, and other values are contemplated even if not specifically discussed herein.

DC drift reducing circuit 112 includes a low frequency voltage controlled oscillator 116 coupled to the output 114 of the signal output integrator 110. The low frequency voltage controlled oscillator 116 produces a frequency output representative of a voltage on the output 114 of the signal output integrator 110 that is fed into a flip-flop circuit 118. DC drift reducing circuit 112 further includes a divider circuit 120 that receives the oscillating signal or a signal representative of the oscillating signal and the divider circuit 120 reduces the frequency of the received signal. Flip-flop 118 receives the frequency output of the low frequency voltage controlled oscillator 116 and the reduced frequency signal from the divider circuit 120. The flip-flop 118 effectively compensating for variations in a DC output from the signal output integrator 110 that is directly related to changes in frequency of the oscillating signal and producing a frequency offset when the DC output 114 from the signal output integrator 110 is related to DC drift.

DC drift reducing circuit 112 further includes a phase locked loop 122 and a crystal oscillator 124 with an associated divider circuit 126, with the output of the crystal oscillator 124 being divided by divider circuit 126 and the output being sent to phase locked loop 122. An output from flip-flop 118 has a signal that is sent through a divider circuit 128 to phase locked loop 122. The phase locked loop 122 of the DC drift reducing circuit 112 receives the frequency offset of the flip-flop 118 and the oscillating signal from the crystal oscillator 124 by way of divider 126.

DC drift reducing circuit 112 further includes an integrator 130 that produces a DC output 132 representative of the DC drift of the output 114 of the signal output integrator 110. The integrator 130 of the DC drift reducing circuit 112 is electrically coupled to the VCO 108 by way of a scaling resistor 134, which provides a voltage that acts to offset or compensate for the DC drift that has been detected in the signal on output 114.

The functioning of DC drift reducing circuit 112 in an FM discriminator circuit 100, can be thought of as having the steps of receiving an oscillating signal at an input 106 of a phase locked loop circuit 104; the sending of a generated frequency from VCO 108 to phase locked loop 104; coupling a signal output integrator 110 to the phased locked loop 104 and to VCO 108; and detecting a direct current (DC) drift of an output 114 of the signal output integrator 110 with DC drift reducing circuit 112 by comparing a frequency of the oscillating signal on input 106 to a signal generated that is representative of a DC level on the output 114.

DC coupled phase locked loop (PLL) demodulator design 102 has an edge triggered phase locked loop 104 that causes the leading edge of the Intermediate Frequency (IF) pulses in input 106 to be aligned with those from Voltage Controlled Oscillator (VCO) 108. The PLL 104 has three output states—a low impedance path to +V in case the IF pulse arrives first, a low impedance path to ground if the VCO 108 pulse arrives first, and a high impedance mode if they arrive simultaneously. The output of the integrator 110 drives the VCO 108 to lock as well as forms the demodulated output on line 114. While this part of circuit 102 demonstrates DC coupling, the DC voltage will drift over time and temperature if not for DC drift reducing circuit 112.

To understand how circuit 102 works, assume an initial condition with both phase locked loops 104 and 122 being locked. The output of integrator 110 (U2) is then at 0.000 Vdc. Let's also assume that the output of integrator 130 (U11) is also at 0.000 Vdc. Note that the output of U2 drives a (relatively) low frequency, low drift, VCO 116 (U4) with a center frequency of 500 KHz. Note also that an internal VCO of U1 drives a /16 counter (divider) 120 which in turn serves as a clock pulse to the D flip flop 118 (U5). Flip flop 118 is normally set. At the negative going edge of the output of U4, the flip flop U5 is steered to reset. At the next positive going edge of the output of counter (divider) 120 (U6), U5 is then reset. Due to diode CR2 the flip flop 118 is immediately steered to set. At the next rising edge of the output of the /16 counter 120, U5 is then again set. This action then masks one pulse of the output of U6. At a center frequency of 500 KHz, the output at the right side of resistor R3 is then reduced from 8.75 MHz (140 MHz/16) to 8.25 MHz. This frequency is then compared in the PLL 122 with a 33 MHz crystal oscillator 124 that has been counted down by 512 by divider 126. At this point, the loop is satisfied and the Video Output remains at 0.000 VDC.

Now looking at an upper band edge of 144 MHz arriving at input 106. At this input frequency the PLL U1 will lock to this and send 144 MHz to the /16 U6 counter resulting in an output of 9.00 MHz. The output of U2 integrator 110 will increase to 1.000 VDC which will cause U4 to increase frequency to 750 KHz. U5 and associated circuitry will subtract the 750 KHz from the 9.00 MHz again resulting in 8.25 MHz as is required for the loop to stay in lock.

A similar action occurs at a lower band edge of 136 MHz input on input 106 in that the output of U6 is now 8.50 MHz and the output of U4 is now 250 KHz. Subtracting these again results in 8.25 MHz.

Now look what happens when the VCO U3 drifts. Let's assume that the VCO 108 drifts such that 0.1 VDC is now required for VCO U3 108 to oscillate at 140 MHz at the center frequency. PLL U1 104 and associated circuitry will integrate up to generate the required 0.1 VDC. This 0.1 VDC drift however causes U4 to oscillate at a higher frequency which in turn causes U5 and associated circuitry to subtract more resulting in a lower frequency being sent to PLL U10. This then causes the output of integrator U11 130 to increase to 1.10 VDC. This then "pushes" the U2 output to decrease to 0.000 VDC. With the U2 output at 0.000 VDC, R1 and R2 act as a voltage divider sending 0.1 VDC to VCO U3.

Figure 5:
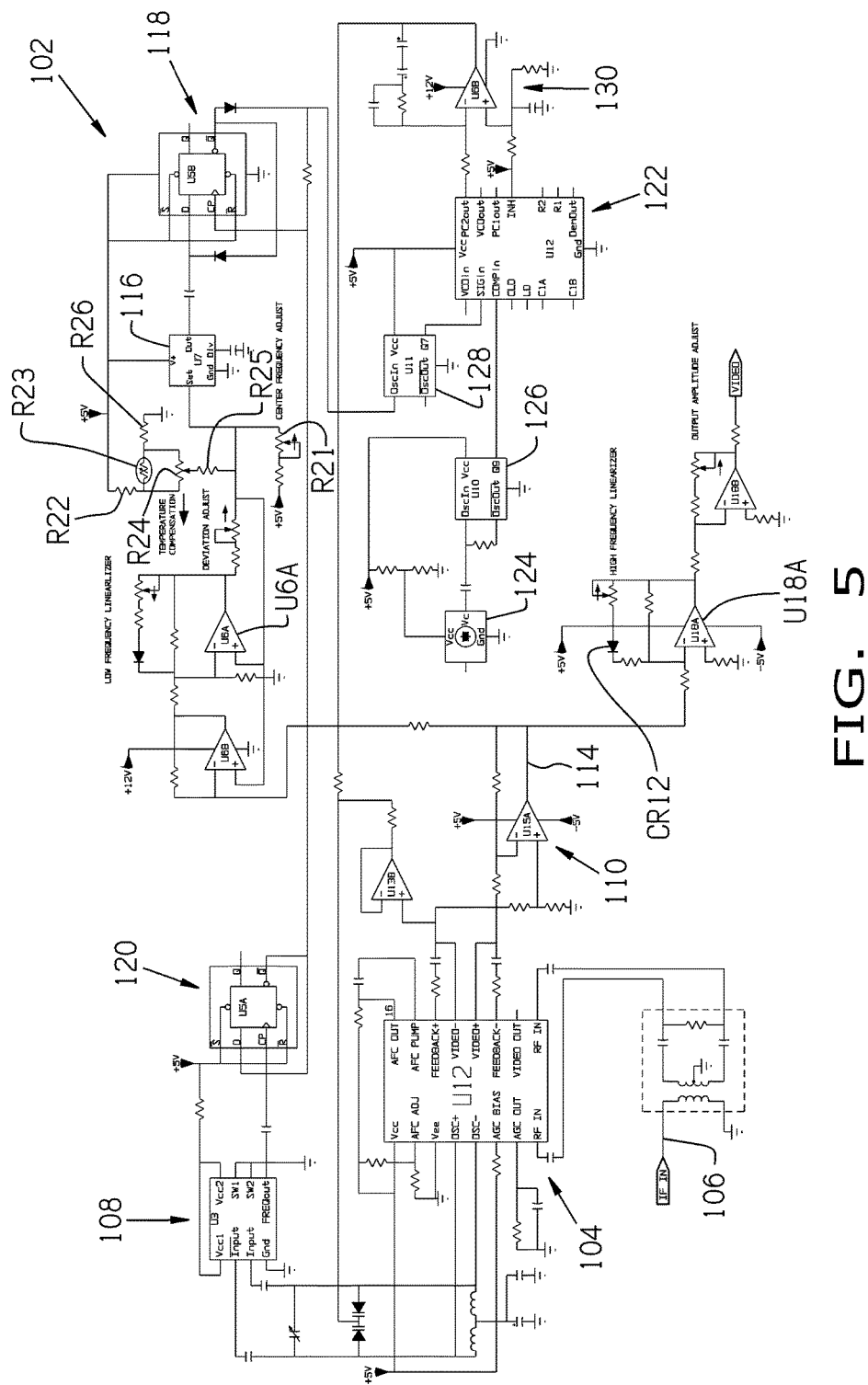
FIG. 5 is a circuit diagram with still more details of the circuit of FIGS. 2-4.

The DC drift of the Video Output 114 voltage due to time and temperature is now dependent on the slight drift of the low frequency oscillator U4 116 plus the much slighter drift of the crystal U8 124. Both of these drifts can be removed by the network of resistors and potentiometer R22 through R26 as shown in FIG. 5.

Figure 4:
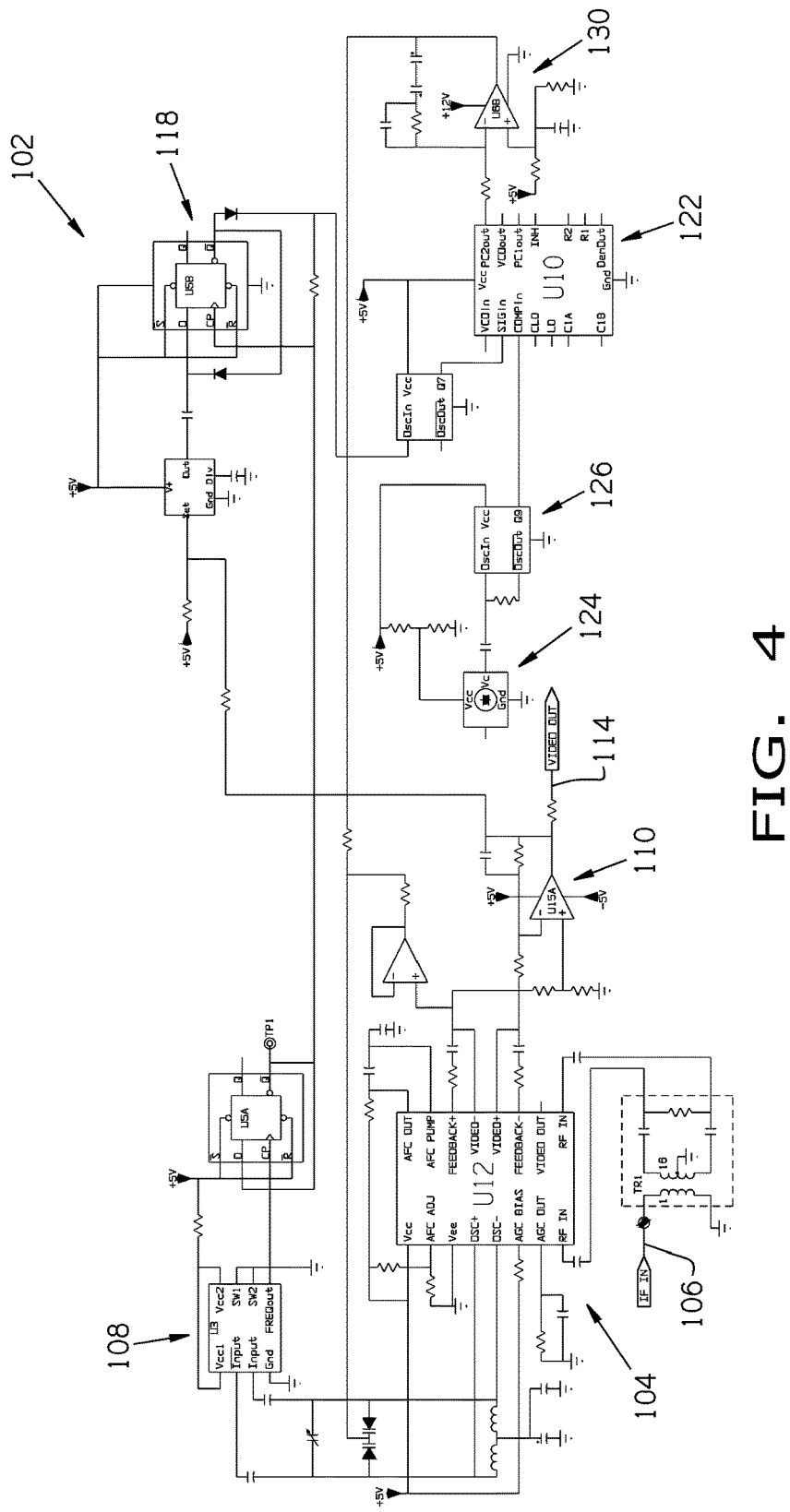
FIG. 4 is a circuit diagram with even more details of the circuit of FIGS. 2 and 3.

FIG. 4 illustrates more details of an embodiment of a typical circuit of the present invention. FIG. 5 is a full implementation including the circuitry of FIG. 4 plus linearizers for both the low frequency oscillator U7 and PLL U12 as well as a temperature compensation network for the low frequency oscillator mentioned above.

Operation of the linearizers is as follows. Looking at output line 114 of integrator 110 in FIG. 5, this point swings around ground as the deviation goes from Fc+4 MHz to Fc −4 MHz. However the voltage at output 114 swings more negative than positive to accommodate these deviations. At a positive swing the gain of stage U18A is 4.75 and diode CR12 is back biased. At a negative swing of output 114, the output of U18A goes positive thereby forward biasing CR12. This then kills some gain of this stage and causes an equal deviation around ground of the output of U18A.

The linearizer for the low frequency oscillator operates identically other than U6A swings positive and negative around 3.9 VDC.

Now for the temperature compensation. Looking at the resistor network R22 through R26. R23 is a thermistor with a resistance of 10 Kohms at +25° C. At +70° C. this falls to less than 1 Kohms and at −20° C. it rises to over 100 Kohms. Therefore, turning potentiometer R24 in a clockwise rotation results in a negative temperature compensation while a positive temperature compensation is the case when potentiometer R24 is turned in a counter clockwise rotation. The adjustable potentiometer R24 is configured to feed a voltage that is influenced by the thermistor to be either a positive temperature coefficient or a negative temperature coefficient voltage to the low frequency voltage controlled oscillator 116 depending on the adjustment of the potentiometer R24.

With this network and careful adjusting of potentiometer R24, the last bit of voltage drift can be removed from the demodulator 102. In actual circuits, voltage drift was lowered from well over 300 mV in the circuit of FIG. 1 to less than 5 mV in the circuit of FIG. 5.

While this invention has been described with respect to at least one embodiment, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

What is claimed is:

1. An electronic assembly comprising:
    a phase locked discriminator circuit including:
        a phase locked loop having an input to receive an oscillating signal;
        a voltage controlled oscillator (VCO) coupled to the phase locked loop;
        a signal output integrator coupled to the phased locked loop and the VCO; and
        a direct current (DC) drift reducing circuit electrically coupled to the phase locked loop, the signal output integrator and the VCO, the DC drift reducing circuit detecting a DC drift of an output of the signal output integrator by comparing a frequency of the oscillating signal to a signal that is representative of the DC drift.

2. The electronic assembly of claim 1, wherein the DC drift reducing circuit compensates for the DC drift by supplying at least a portion of a DC voltage to the VCO to thereby reduce the DC drift of the output of the signal output integrator.

3. The electronic assembly of claim 1, wherein the DC drift reducing circuit includes a low frequency voltage controlled oscillator coupled to the output of the signal output integrator, the low frequency voltage controlled oscillator producing a frequency output representative of a voltage on the output of the signal output integrator.

4. The electronic assembly of claim 3, wherein the DC drift reducing circuit further includes a divider circuit that receives the oscillating signal or a signal representative of the oscillating signal, the divider circuit reducing the frequency of the received signal.

5. The electronic assembly of claim 4, wherein the DC drift reducing circuit further includes a flip-flop that receives the frequency output of the low frequency voltage controlled oscillator and the reduced frequency signal from the divider circuit, the flip-flop effectively compensating for variations in a DC output from the signal output integrator that are directly related to changes in frequency of the oscillating signal and producing a frequency offset when the DC output from the signal output integrator is related to DC drift.

6. The electronic assembly of claim 5, wherein the DC drift reducing circuit further includes a phase locked loop and a crystal oscillator, the phase locked loop of the DC drift reducing circuit receiving the frequency offset of the flip-flop and an oscillating signal from the crystal oscillator.

7. The electronic assembly of claim 6, wherein the DC drift reducing circuit further includes an integrator that produces a DC output representative of the DC drift of the output of the signal output integrator, the integrator of the DC drift reducing circuit is electrically coupled to the VCO by way of a scaling resistor.

8. The electronic assembly of claim 3, further comprising a thermistor and a resistor network, the resistor network including an adjustable potentiometer configured to feed a voltage that is influenced by the thermistor to be either a positive temperature coefficient or a negative temperature coefficient voltage depending on the adjustment of the potentiometer to the low frequency voltage controlled oscillator.

9. A DC coupled phase locked loop FM discriminator system, comprising:
- a phase locked loop having an input to receive an oscillating signal;
- a voltage controlled oscillator (VCO) coupled to the phase locked loop;
- a signal output integrator coupled to the phased locked loop and the VCO; and
- a direct current (DC) drift reducing circuit electrically coupled to the phase locked loop, the signal output integrator and the VCO, the DC drift reducing circuit detecting a DC drift of an output of the signal output integrator by comparing a frequency of the oscillating signal to a signal that is representative of the detected DC drift.

10. The DC coupled phase locked loop FM discriminator system of claim 9, wherein the DC drift reducing circuit compensates for the DC drift by supplying at least a portion of a DC voltage to the VCO to thereby reduce the DC drift of the output of the signal output integrator.

11. The DC coupled phase locked loop FM discriminator system of claim 9, wherein the DC drift reducing circuit includes a low frequency voltage controlled oscillator coupled to the output of the signal output integrator, the low frequency voltage controlled oscillator producing a frequency output representative of a voltage on the output of the signal output integrator.

12. The DC coupled phase locked loop FM discriminator system of claim 11, wherein the DC drift reducing circuit further includes a divider circuit that receives the oscillating signal or a signal representative of the oscillating signal, the divider circuit reducing the frequency of the received signal.

13. The DC coupled phase locked loop FM discriminator system of claim 12, wherein the DC drift reducing circuit further includes a flip-flop that receives the frequency output of the low frequency voltage controlled oscillator and the reduced frequency signal from the divider circuit, the flip-flop effectively compensating for variations in a DC output from the signal output integrator that are directly related to changes in frequency of the oscillating signal and producing a frequency offset when the DC output from the signal output integrator is related to DC drift.

14. The DC coupled phase locked loop FM discriminator system of claim 13, wherein the DC drift reducing circuit further includes a phase locked loop and a crystal oscillator, the phase locked loop of the DC drift reducing circuit receiving the frequency offset of the flip-flop and an oscillating signal from the crystal oscillator.

15. The DC coupled phase locked loop FM discriminator system of claim 14, wherein the DC drift reducing circuit further includes an integrator that produces a DC output representative of the DC drift of the output of the signal output integrator.

16. The DC coupled phase locked loop FM discriminator system of claim 15, wherein the integrator of the DC drift reducing circuit is electrically coupled to the VCO by way of a scaling resistor.

17. A method of reducing DC drift in an FM discriminator circuit, the method comprising the steps of:
- receiving an oscillating signal at an input of a phase locked loop circuit;
- sending a generated frequency from a voltage controlled oscillator (VCO) to the phase locked loop;
- coupling a signal output integrator to the phased locked loop and to the VCO; and
- detecting a direct current (DC) drift of an output of the signal output integrator with a DC drift reducing circuit by comparing a frequency of the oscillating signal to a signal generated that is representative of a DC level on the output.

18. The method of claim 17, wherein the DC drift reducing circuit compensates for the DC drift by supplying at least a portion of a DC voltage to the VCO to thereby reduce the DC drift of the output of the signal output integrator.

19. The method of claim 17, wherein the DC drift reducing circuit includes a low frequency voltage controlled oscillator coupled to the output of the signal output integrator, the low frequency voltage controlled oscillator producing a frequency output representative of a voltage on the output of the signal output integrator.

20. The method of claim 19, wherein the DC drift reducing circuit further includes a divider circuit that receives the oscillating signal or a signal representative of the oscillating signal, the divider circuit reducing the frequency of the received signal.

21. The method of claim 20, wherein the DC drift reducing circuit further includes a flip-flop that receives the frequency output of the low frequency voltage controlled oscillator and the reduced frequency signal from the divider circuit, the flip-flop effectively compensating for variations in a DC output from the signal output integrator that are directly related to changes in frequency of the oscillating signal and producing a frequency offset when the DC output from the signal output integrator is related to DC drift.

* * * * *